(12) United States Patent
Xiao et al.

(10) Patent No.: US 11,195,863 B2
(45) Date of Patent: Dec. 7, 2021

(54) DISPLAY PANEL HAVING A STORAGE CAPACITOR, MANUFACTURING METHOD THE SAME THEREOF AND DISPLAY MODULE HAVING THE SAME

(71) Applicant: SHENZHEN CHINA STAR OPTOELECTRONICS SEMICONDUCTOR DISPLAY TECHNOLOGY CO., LTD., Shenzhen (CN)

(72) Inventors: Hui Xiao, Shenzhen (CN); Jangsoon Im, Shenzhen (CN)

( * ) Notice: Subject to any disclaimer, the term of this patent is extended or adjusted under 35 U.S.C. 154(b) by 403 days.

(21) Appl. No.: 16/326,719

(22) PCT Filed: Aug. 10, 2018

(86) PCT No.: PCT/CN2018/109297
§ 371 (c)(1),
(2) Date: Feb. 20, 2019

(87) PCT Pub. No.: WO2020/056803
PCT Pub. Date: Mar. 26, 2020

(65) Prior Publication Data
US 2021/0183911 A1    Jun. 17, 2021

(30) Foreign Application Priority Data

Sep. 21, 2018 (CN) .......................... 201811107960.2

(51) Int. Cl.
*H01L 29/04* (2006.01)
*H01L 27/12* (2006.01)
(Continued)

(52) U.S. Cl.
CPC ...... *H01L 27/1255* (2013.01); *H01L 27/1262* (2013.01); *H01L 27/323* (2013.01); *H01L 27/3258* (2013.01); *H01L 27/3262* (2013.01); *H01L 27/3265* (2013.01); *H01L 27/3272* (2013.01); *H01L 51/5237* (2013.01); *H01L 51/56* (2013.01)

(58) Field of Classification Search
CPC ............. H01L 27/1255; H01L 27/1262; H01L 27/3258; H01L 27/3262; H01L 27/3265
See application file for complete search history.

(56) References Cited

U.S. PATENT DOCUMENTS

| | | | |
|---|---|---|---|
| 6,949,771 B2 * | 9/2005 | Yoganandan | ......... H01L 33/486 257/99 |
| 2012/0104399 A1 * | 5/2012 | Choi | ................... H01L 27/3265 257/59 |

(Continued)

*Primary Examiner* — Phuc T Dang (57) ABSTRACT

The present application proposes a display panel, a manufacturing method for the display panel, and a display module. The display panel includes an array substrate. The array substrate includes a substrate and a thin film transistor and a storage capacitor on the substrate. The storage capacitor includes a first electrode on the substrate, a first insulating layer on the first electrode, a second electrode on the first insulating layer, a second insulating layer on the second electrode, and a third electrode on the second insulating layer. An orthogonal projection of the second electrode on the second insulating layer is on the second insulating layer.

17 Claims, 6 Drawing Sheets

(51) Int. Cl.
*H01L 27/32* (2006.01)
*H01L 51/52* (2006.01)
*H01L 51/56* (2006.01)

(56) References Cited

U.S. PATENT DOCUMENTS

2015/0331288 A1* 11/2015 Hsieh ................ G02F 1/134309
                                                                       349/12
2017/0373094 A1* 12/2017 Park .................... H01L 27/3265

* cited by examiner

DISPLAY PANEL HAVING A STORAGE CAPACITOR, MANUFACTURING METHOD THE SAME THEREOF AND DISPLAY MODULE HAVING THE SAME

BACKGROUND

1. Field of the Invention

The present application relates to the field of display, more particularly, to a display panel and a manufacturing method thereof and a display module.

2. Description of the Related Art

In the flat panel display technology, the organic light-emitting diode (OLED) display has many advantages, such as light and thin, active illumination, fast response, large viewing angle, wide color gamut, high brightness and low power consumption, and has gradually become the third generation display technology after liquid crystal displays.

With the development of display panels, the storage capacitors in the now existing display panels can not meet the requirements of the high-resolution display panels, and the display effect of the display panels is thus reduced.

Therefore, there is a need to provide a display panel to resolve the above-mentioned problems.

SUMMARY

The present application provides a display panel and a manufacturing method thereof and a display module to resolve the technical problem that the storage capacitance of the display panel of the related art is low.

The present application provides a display panel. The display panel comprises an array substrate. The array substrate comprises a substrate and a thin film transistor and a storage capacitor on the substrate. The storage capacitor comprises a first electrode on the substrate, a first insulating layer on the first electrode, a second electrode on the first insulating layer, a second insulating layer on the second electrode, and a third electrode on the second insulating layer. An orthogonal projection of the second electrode on the second insulating layer is on the second insulating layer.

Optionally, an orthogonal projection area of the second electrode on the substrate is equal to an orthogonal projection area of the second insulating layer on the substrate.

Optionally, an orthogonal projection area of the second electrode on the substrate is smaller than an orthogonal projection area of the second insulating layer on the substrate.

Optionally, the second insulating layer comprises aluminum oxide.

Optionally, the thin film transistor comprises a light shielding layer on the substrate, a buffer layer on the light shielding layer, an active layer on the buffer layer, a gate insulating layer on the active layer, a gate layer on the gate insulating layer, an interlayer insulating layer on the gate layer, source and drain layers on the interlayer insulating layer, and a passivation layer on the source and drain layers. The first electrode is disposed on a same layer as the light shielding layer. The first insulating layer is disposed on a same layer as the buffer layer. The second electrode is disposed on a same layer as the active layer. The third electrode is disposed on a same layer as the gate layer.

Optionally, the thin film transistor comprises a light shielding layer on the substrate, a buffer layer on the light shielding layer, an active layer on the buffer layer, a gate insulating layer on the active layer, a gate layer on the gate insulating layer, an interlayer insulating layer on the gate layer, source and drain layers on the interlayer insulating layer, and a passivation layer on the source and drain layers. The first electrode is disposed on a same layer as the light shielding layer. The first insulating layer is disposed on a same layer as the buffer layer. The second electrode is disposed on a same layer as the active layer. The third electrode is disposed on a same layer as the source and drain layers.

Optionally, the storage capacitor further comprises a fourth electrode. When the third electrode is disposed on a same layer as the gate layer, the fourth electrode is disposed on a same layer as the source and drain layers.

The present application further provides a method of manufacturing a display panel comprising: providing a substrate; forming a thin film transistor and a storage capacitor on the substrate; and forming organic light-emitting layers on the thin film transistor and the storage capacitor. The storage capacitor comprises a first electrode, a first insulating layer, a second electrode, a second insulating layer, and a third electrode sequentially stacked on the substrate, and an orthogonal projection of the second electrode on the second insulating layer is on the second insulating layer.

Optionally, an orthogonal projection area of the second electrode on the substrate is equal to an orthogonal projection area of the second insulating layer on the substrate.

Optionally, an orthogonal projection area of the second electrode on the substrate is smaller than an orthogonal projection area of the second insulating layer on the substrate.

Optionally, the second insulating layer comprises aluminum oxide.

Optionally, the thin film transistor comprises a light shielding layer on the substrate, a buffer layer on the light shielding layer, an active layer on the buffer layer, a gate insulating layer on the active layer, a gate layer on the gate insulating layer, an interlayer insulating layer on the gate layer, source and drain layers on the interlayer insulating layer, and a passivation layer on the source and drain layers. The first electrode is disposed on a same layer as the light shielding layer. The first insulating layer is disposed on a same layer as the buffer layer. The second electrode is disposed on a same layer as the active layer. The third electrode is disposed on a same layer as the gate layer, or the third electrode is disposed on a same layer as the source and drain layers.

Optionally, the storage capacitor further comprises a fourth electrode. When the third electrode is disposed on a same layer as the gate layer, the fourth electrode is disposed on a same layer as the source and drain layers.

The present application still provides a display module, a touch layer, a polarizing layer and a cover layer on the display panel. The display panel comprises an array substrate. The array substrate comprises a substrate and a thin film transistor and a storage capacitor on the substrate. The storage capacitor comprises a first electrode on the substrate, a first insulating layer on the first electrode, a second electrode on the first insulating layer, a second insulating layer on the second electrode, and a third electrode on the second insulating layer. An orthogonal projection of the second electrode on the second insulating layer is on the second insulating layer.

Optionally, an orthogonal projection area of the second electrode on the substrate is equal to an orthogonal projection area of the second insulating layer on the substrate.

Optionally, an orthogonal projection area of the second electrode on the substrate is smaller than an orthogonal projection area of the second insulating layer on the substrate.

Optionally, the second insulating layer comprises aluminum oxide.

Optionally, the thin film transistor comprises a light shielding layer on the substrate, a buffer layer on the light shielding layer, an active layer on the buffer layer, a gate insulating layer on the active layer, a gate layer on the gate insulating layer, an interlayer insulating layer on the gate layer, source and drain layers on the interlayer insulating layer, and a passivation layer on the source and drain layers. The first electrode is disposed on a same layer as the light shielding layer. The first insulating layer is disposed on a same layer as the buffer layer. The second electrode is disposed on a same layer as the active layer. The third electrode is disposed on a same layer as the gate layer.

Optionally, the thin film transistor comprises a light shielding layer on the substrate, a buffer layer on the light shielding layer, an active layer on the buffer layer, a gate insulating layer on the active layer, a gate layer on the gate insulating layer, an interlayer insulating layer on the gate layer, source and drain layers on the interlayer insulating layer, and a passivation layer on the source and drain layers. The first electrode is disposed on a same layer as the light shielding layer. The first insulating layer is disposed on a same layer as the buffer layer. The second electrode is disposed on a same layer as the active layer. The third electrode is disposed on a same layer as the source and drain layers.

Optionally, the storage capacitor further comprises a fourth electrode. When the third electrode is disposed on a same layer as the gate layer, the fourth electrode is disposed on a same layer as the source and drain layers.

The advantageous effects are as follows: the present application uses the active layer as the second electrode in the storage capacitor region, and disposes an insulating layer having a high electrostatic force constant between the second electrode and the third electrode. The capacitance of the storage capacitor is thus increased to improve the display effect of the display panel.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
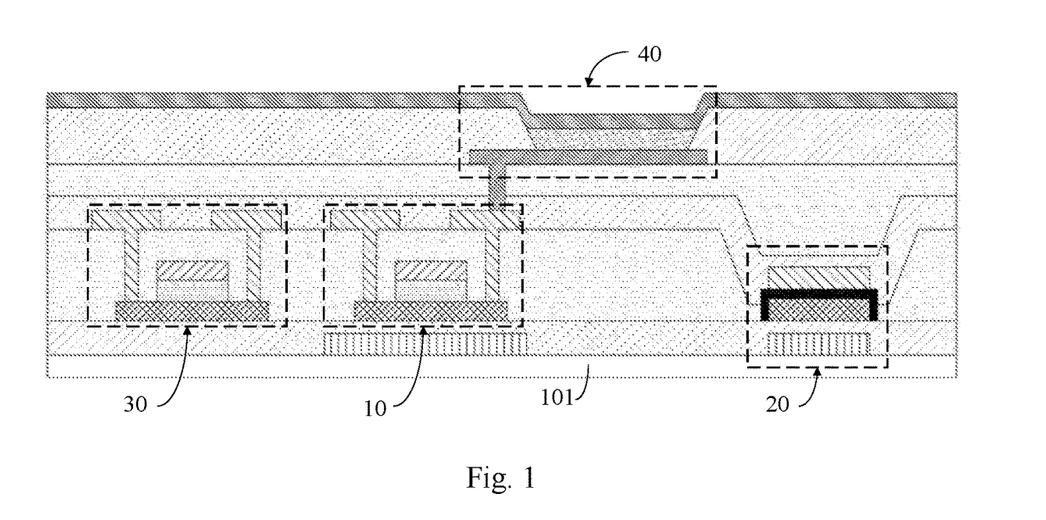
FIG. 1 is a structural diagram of film layers of a display panel of the related art.

A description is provided with reference to FIG. 1. FIG. 1 is a structural diagram of film layers of a display panel of the related art.

The display panel comprises an array substrate. The array substrate comprises a substrate 101, a thin film transistor layer on the substrate 101, and a light-emitting device layer 40 on the thin film transistor layer.

The thin film transistor layer comprises a thin film transistor 10, a storage capacitor 20, and a switching unit 30. A detailed description of the switching unit 30 in FIG. 1 is not provided in this application.

Figure 2:
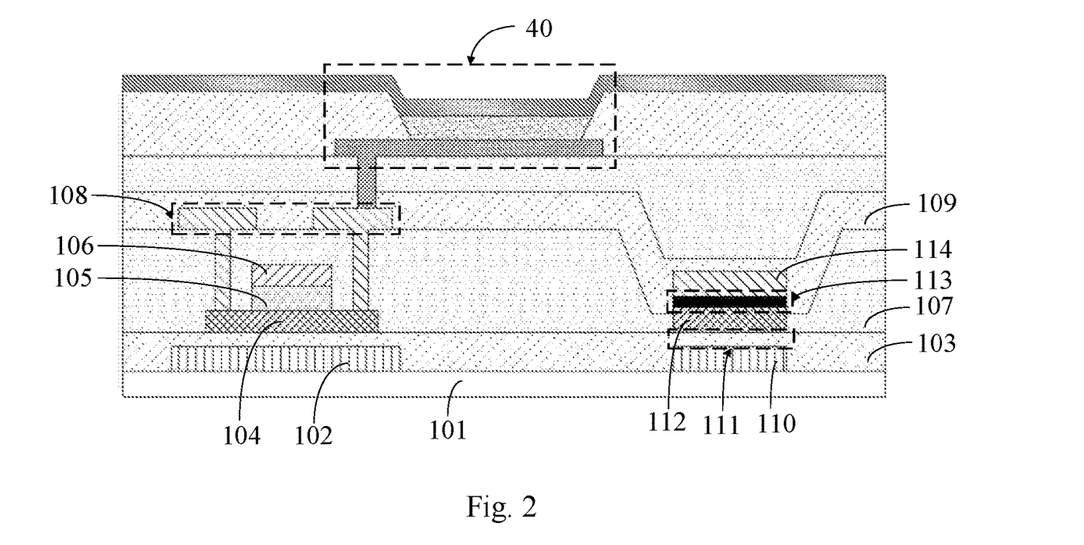
FIG. 2 is a structural diagram of film layers of a display panel according to a first embodiment of the present application.

FIG. 2 is a structural diagram of film layers of a display panel according to a first embodiment of the present application.

The substrate 101 may be one of a glass substrate, a quartz substrate, a resin substrate, and the like. When the array substrate is a flexible substrate, it may be an organic polymer.

In one embodiment, the flexible material may be a polyimide thin film.

The thin film transistor 10 comprises an etch stop layer (ESL) structure, a back channel etch (BCE) structure or a top-gate thin film transistor (Top-gate) structure, and the present application is not limited in this regard. For example, the top gate thin film transistor structure may comprise a light shielding layer 102, a buffer layer 103, an active layer 104, a gate insulating layer 105, a gate layer 106, an interlayer insulating layer 107, source and drain layers 108, a passivation layer 109, and a planarization layer.

The light shielding layer 102 is formed on the substrate 101. The light shielding layer 102 is mainly used to block light from entering the thin film transistor 10, which in turn affects the driving effect of the thin film transistor.

The buffer layer 103 is formed on the light shielding layer 102. The buffer layer 103 is mainly used to buffer the pressure between film layers and block the entry of moisture and oxygen into the inner film layers.

The active layer 104 is formed on the buffer layer 103. The active layer 104 comprises doped regions (not shown in the figure) formed by ion doping.

The gate insulating layer 105 is formed on the active layer 104.

In one embodiment, the gate insulating layer 105 covers the active layer 104. The interlayer insulating layer 107 is used to isolate the active layer 104 from other metal layers.

The gate layer 106 is formed on the gate insulating layer 105. A metallic material of the gate layer 106 may generally be a metal, such as molybdenum, aluminum, aluminum-nickel alloy, molybdenum-tungsten alloy, chromium, or copper, or a combination of the above-mentioned metallic materials.

In one embodiment, the metallic material of the gate layer 106 may be molybdenum.

The interlayer insulating layer 107 is formed on the gate layer 106.

In one embodiment, the interlayer insulating layer 107 covers the gate layer 106.

The source and drain layers 108 are formed on the interlayer insulating layer 107.

A metallic material of the source and drain layers 108 may generally be a metal, such as molybdenum, aluminum, aluminum-nickel alloy, molybdenum-tungsten alloy, chromium, copper or titanium-aluminum alloy, or a combination of the above-mentioned metallic materials.

In one embodiment, the metallic material of the source and drain layers 108 may be a titanium-aluminum alloy. The source and drain layers 108 are electrically connected to the doped regions on the active layer 104 through via holes.

The passivation layer 109 and the planarization layer are formed on the source and drain layers 108.

The passivation layer 109 is used to ensure the flatness of the thin film transistor process.

A description is provided with reference to FIG. 2. The storage capacitor 20 comprises a first electrode 110 on the substrate 101, a first insulating layer 111 on the first electrode 110, a second electrode 112 on the first insulating layer 111, a second insulating layer 113 on the second electrode 112, and a third electrode 114 on the second insulating layer 113.

In one embodiment, an orthogonal projection of the second electrode 112 on the second insulating layer 113 is on the second insulating layer 113.

In one embodiment, the first electrode 110 is disposed on a same layer as the light shielding layer 102, that is, the first electrode 110 and the light shielding layer 102 are formed in the same photographic process. Similarly, the first insulating layer 111 is disposed on a same layer as the buffer layer 103. The second electrode 112 is disposed on a same layer as the active layer 104. The third electrode 114 is disposed on a same layer as the gate layer 106.

In one embodiment, the third electrode 114 may be disposed on a same layer as the source and drain layers 108.

In the first embodiment, an orthogonal projection area of the second electrode 112 on the substrate 101 is equal to an orthogonal projection area of the second insulating layer 113 on the substrate 101.

Figure 3:
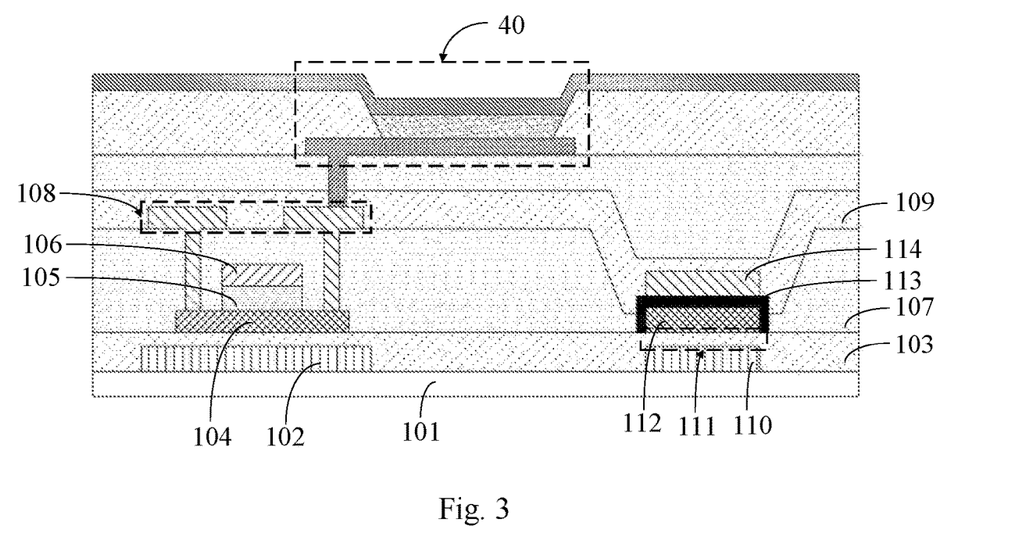
FIG. 3 is a structural diagram of film layers of a display panel according to a second embodiment of the present application.

A description is provided with reference to FIG. 3. FIG. 3 is a structural diagram of film layers of a display panel according to a second embodiment of the present application.

In the second embodiment, the orthogonal projection area of the second electrode 112 on the substrate 101 is smaller than the orthogonal projection area of the second insulating layer 113 on the substrate 101.

The second insulating layer 113 covers the second electrode 112 and acts as an etch stop layer to prevent the second electrode 112 from being damaged by subsequent etching processes.

In one embodiment, the second insulating layer 113 may be aluminum oxide. Since aluminum oxide has a higher electrostatic force constant (K), the electrostatic force constant is increased when the area and the spacing of the two electrode plates are not changed. The total amount of electrical charge that the storage capacitor 20 can store is increased.

Figure 4:
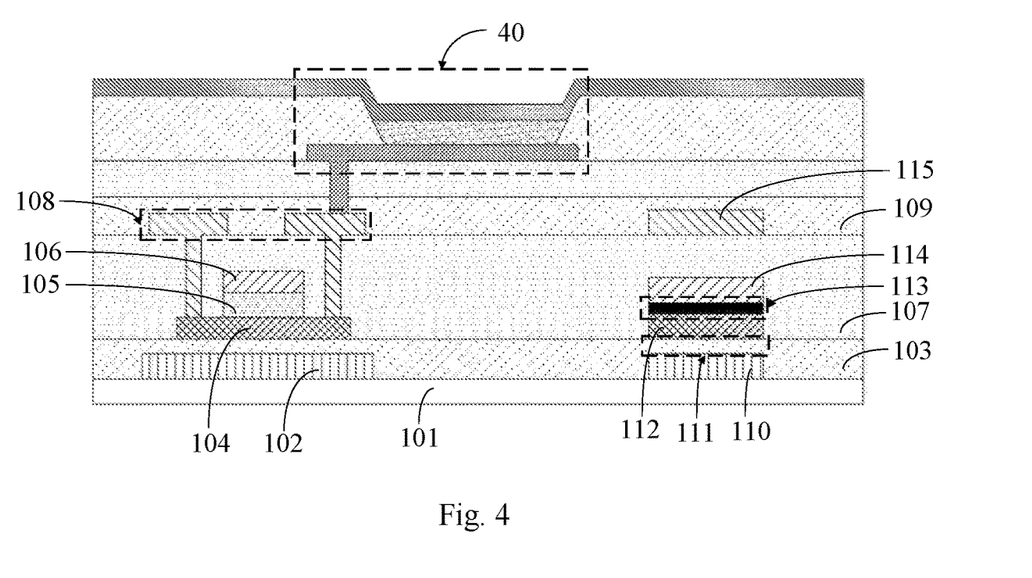
FIG. 4 is a structural diagram of film layers of a display panel according to a third embodiment of the present application.

A description is provided with reference to FIG. 4. FIG. 4 is a structural diagram of film layers of a display panel according to a third embodiment of the present application.

The storage capacitor 20 further comprises a fourth electrode 115.

When the third electrode 114 is disposed on the same layer as the gate layer 106, the fourth electrode 115 is disposed on the same layer as the source and drain layers 108. As compared with FIG. 2 or FIG. 1, three serially connected capacitors increase the total amount of electrical charge that the storage capacitor 20 can store.

Figure 5:
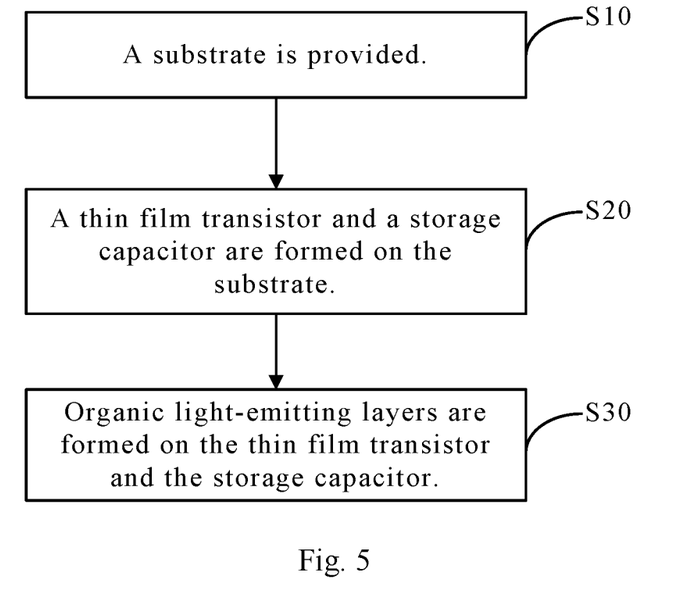
FIG. 5 is a process step diagram of a method for manufacturing a display panel of the present application.

A description is provided with reference to FIG. 5. FIG. 5 is a process step diagram of a method for manufacturing a display panel of the present application. The method comprises the following steps:

S10: A substrate is provided.

In this step, a material of a substrate 201 may be one of a glass substrate, a quartz substrate, a resin substrate, and the like.

When the array substrate is a flexible substrate, it may be an organic polymer. In one embodiment, the flexible material may be a polyimide thin film.

S20: A thin film transistor and a storage capacitor are formed on the substrate.

In this step, the thin film transistor, the storage capacitor, and a switching unit of the display panel are simultaneously formed on the substrate 201. A detailed description of the switching unit is not provided in the present embodiment.

Figure 6:
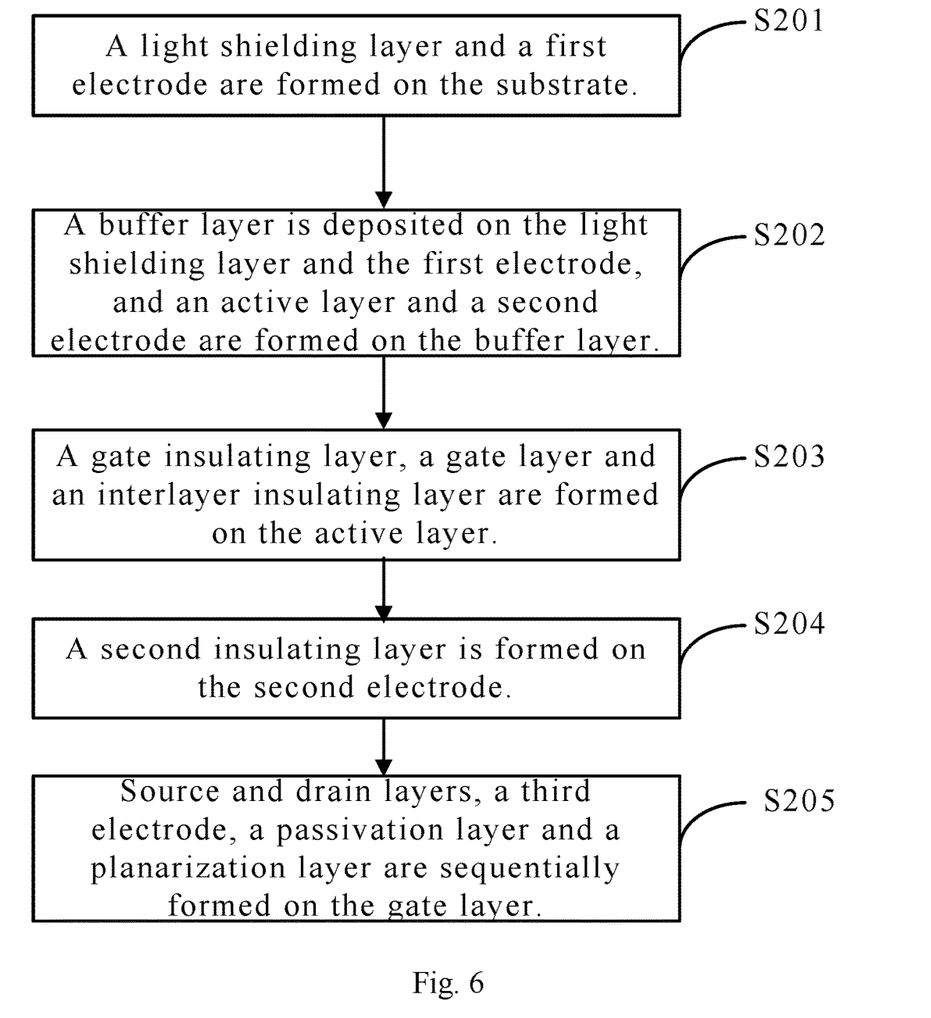
FIG. 6 is another process step diagram of a method for manufacturing a display panel of the present application.

A description is provided with reference to FIG. 6. FIG. 6 is another process step diagram of a method for manufacturing a display panel of the present application. The method comprises the following steps:

S201: A light shielding layer and a first electrode are formed on the substrate.

Figure 7A:
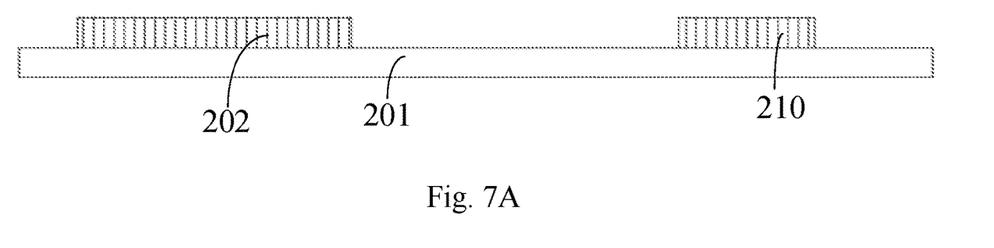
FIG. 7A to FIG. 7G are process diagrams of a method for manufacturing a display panel of the present application.

As shown in FIG. 7A, a first metal layer is deposited on the substrate 201 and patterned to form a light shielding layer 202 of the thin film transistor and a first electrode 210 of the storage capacitor.

In one embodiment, a metallic material of the first metal layer may be molybdenum.

S202: A buffer layer is deposited on the light shielding layer and the first electrode, and an active layer and a second electrode are formed on the buffer layer.

Figure 7B:
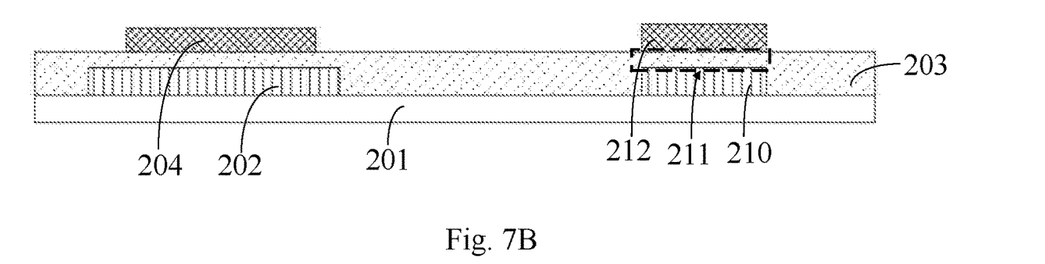

As shown in FIG. 7B, the buffer layer 203 covers the light shielding layer 202 and the first electrode 210. The buffer layer 203 is mainly used to buffer the pressure between film layers and block the entry of moisture and oxygen into the inner film layers.

In this step, an active film layer is first formed on the buffer layer 203. The active film layer is made of polysilicon. Next, a first photographic process is performed on the active film layer to form a first photoresist layer (not shown in the figure) on the active film layer. A mask (not shown in the figure) is used to expose and followed by a development process and a first etching process to pattern the active film layer so as to form an active layer 204 and a second electrode 212 shown in FIG. 7B. The first photoresist layer is stripped.

A first insulating layer 211 between the first electrode 210 and the second electrode 212 is disposed on a same layer as the buffer layer 203.

S203: A gate insulating layer, a gate layer and an interlayer insulating layer are formed on the active layer.

In this step, a gate insulating layer 205 and a gate layer 206 are sequentially formed on the active layer 204. A metallic material of the gate layer 206 may generally be a metal, such as molybdenum, aluminum, aluminum-nickel alloy, molybdenum-tungsten alloy, chromium or copper, or a combination of the above-mentioned metallic materials.

In one embodiment, a material of the gate layer 206 may be molybdenum.

Figure 7C:
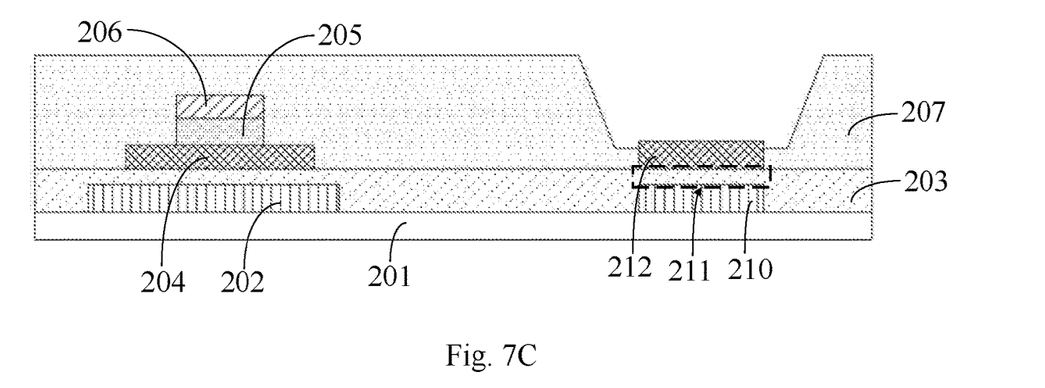

In step S203 and step S204, the first insulating layer 211, the gate insulating layer 205 and the gate layer 206 may be formed in one photographic process so as to form a pattern shown in FIG. 7C.

A interlayer insulating layer 207 is deposited on the gate layer 206 to insulate the gate layer 206 from source and drain layers 208. A hole is formed in the interlayer insulating layer 207 corresponding to the second electrode 212 through an etching process to expose the second electrode.

S204: A second insulating layer is formed on the second electrode.

Figure 7D:
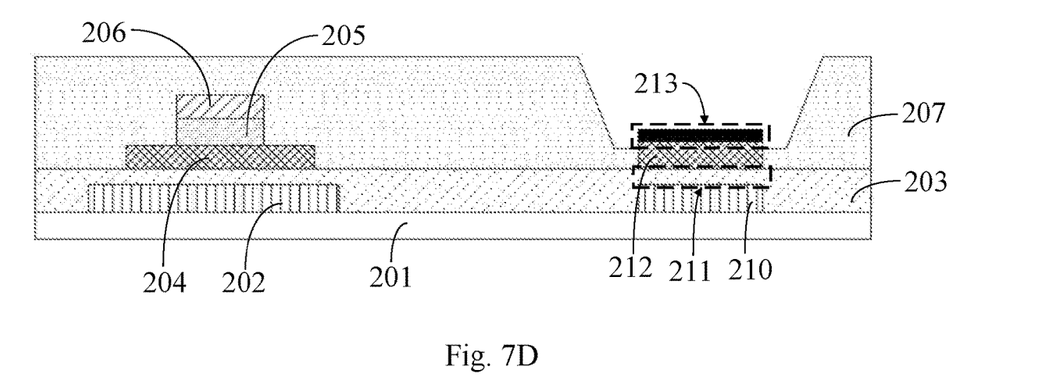
Figure 7E:
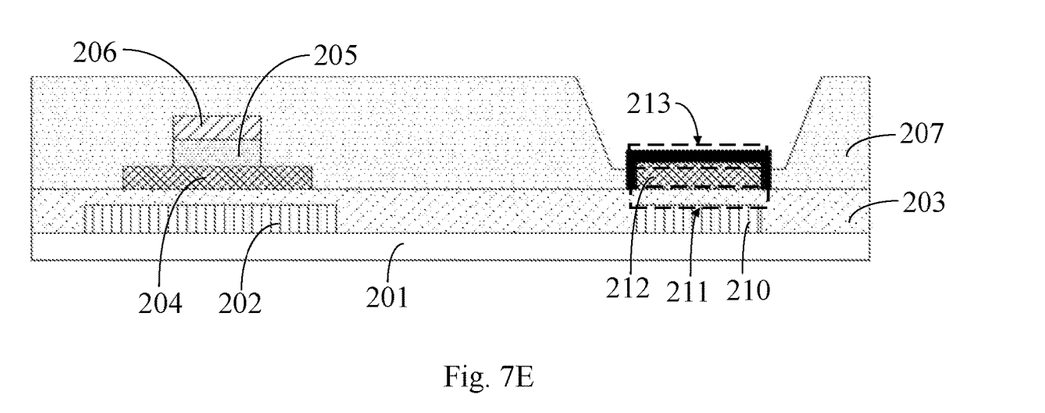

In this step, a second insulating layer 213 is deposited on the active layer 204 and the second electrode 212 followed by a patterning process to form a pattern shown in FIG. 7D or FIG. 7E.

A description is provided with reference to FIG. 7D. An orthogonal projection area of the second electrode 212 on the substrate 201 is equal to an orthogonal projection area of the second insulating layer 213 on the substrate 201.

A description is provided with reference to FIG. 7E. The orthogonal projection area of the second electrode 212 on the substrate 201 is smaller than the orthogonal projection area of the second insulating layer 213 on the substrate 201.

The second insulating layer 213 covers the second electrode 212 and acts as an etch stop layer to prevent the second electrode 212 from being damaged by subsequent etching processes.

In one embodiment, the second insulating layer 213 may be aluminum oxide.

Since aluminum oxide has a higher electrostatic force constant (K), the electrostatic force constant is increased when the area and the spacing of the two electrode plates are not changed. The total amount of electrical charge that the storage capacitor can store is increased.

S205: Source and drain layers, a third electrode, a passivation layer and a planarization layer are sequentially formed on the gate layer.

Figure 7F:
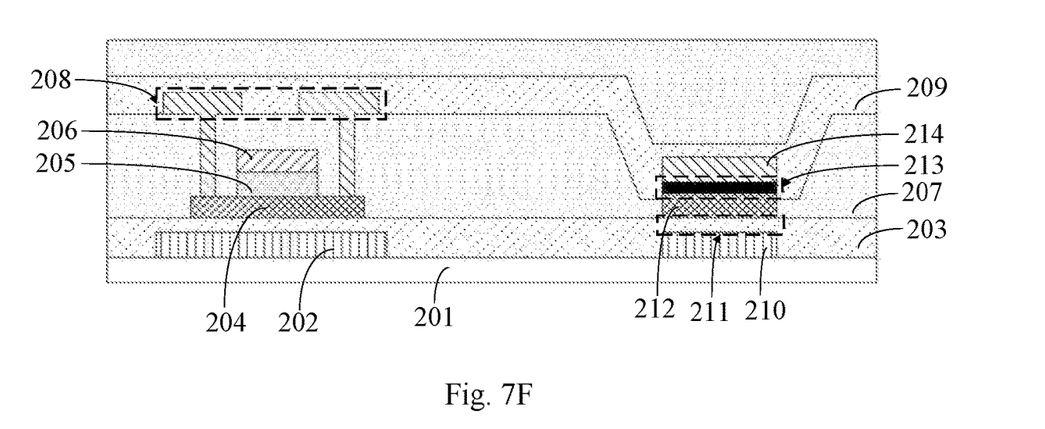

As shown in FIG. 7F, the source and drain layers 208 are formed on the interlayer insulating layer 207. A metallic material of the source and drain layers 208 may generally be a metal, such as molybdenum, aluminum, aluminum-nickel alloy, molybdenum-tungsten alloy, chromium, copper or titanium-aluminum alloy, or a combination of the above-mentioned metallic materials.

In one embodiment, the metallic material of the source and drain layers 208 may be a titanium-aluminum alloy. The source and drain layers 208 are electrically connected to doped regions on the active layer 204 through via holes.

In one embodiment, the third electrode 214 and the source and drain layers 208 are formed in a same photographic process.

A passivation layer 209 and the planarization layer are formed on the source and drain layers 208. The passivation layer 209 and the planarization layer are used to ensure the flatness of the thin film transistor process.

In one embodiment, the storage capacitor further comprises a fourth electrode 215 to form a pattern shown in FIG. 4.

When the third electrode 214 is further disposed on a same layer as the gate layer 206, the fourth electrode 215 is disposed on a same layer as the source and drain layers 208. As compared with FIG. 2 or FIG. 3, three serially connected capacitors increase the total amount of electrical charge that the storage capacitor can store.

S30: Organic light-emitting layers are formed on the thin film transistor and the storage capacitor.

Figure 7G:
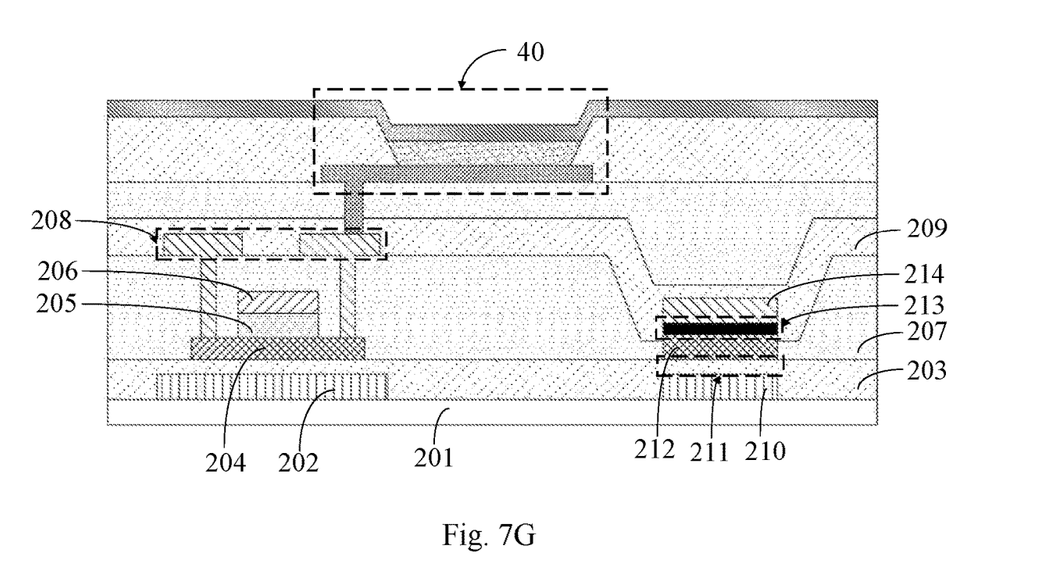

As shown in FIG. 7G, in this step, organic light-emitting layers 40 and an encapsulation layer (not shown in the figure) are formed on the thin film transistor and the storage capacitor to complete the manufacturing of the display panel.

The present application further provides a display module. The display module comprises the above display panel and a touch layer, a polarizing layer and a cover layer on the display panel.

In one embodiment, the working principle of the display module is the same as that of the above display panel, and a detailed description in this regard is not provided in this application.

The present application provides a display panel and a manufacturing method thereof and a display module. The display panel includes a substrate and a thin film transistor and a storage capacitor on the substrate. The storage capacitor includes a first electrode on the substrate, a first insulating layer on the first electrode, a second electrode on the first insulating layer, a second insulating layer on the second electrode, and a third electrode on the second insulating layer. An orthogonal projection of the second electrode on the second insulating layer is on the second insulating layer. The present application uses the active layer as the second electrode in the storage capacitor region, and disposes an insulating layer having a high electrostatic force constant between the second electrode and the third electrode. The capacitance of the storage capacitor is thus increased to improve the display effect of the display panel.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A display panel comprising an array substrate, the array substrate comprising a substrate and a thin film transistor and a storage capacitor on the substrate;
   the storage capacitor comprising a first electrode on the substrate, a first insulating layer on the first electrode, a second electrode on the first insulating layer, a second insulating layer on the second electrode, and a third electrode on the second insulating layer;
   wherein an orthogonal projection of the second electrode on the second insulating layer is on the second insulating layer, and an orthogonal projection area of the second electrode on the substrate is equal to an orthogonal projection area of the second insulating layer on the substrate.

2. The display panel as claimed in claim 1, wherein an orthogonal projection area of the second electrode on the substrate is smaller than an orthogonal projection area of the second insulating layer on the substrate.

3. The display panel as claimed in claim 1, wherein the second insulating layer comprises aluminum oxide.

4. The display panel as claimed in claim 1, wherein the thin film transistor comprises:
   a light shielding layer on the substrate, a buffer layer on the light shielding layer, an active layer on the buffer layer, a gate insulating layer on the active layer, a gate layer on the gate insulating layer, an interlayer insulating layer on the gate layer, source and drain layers on the interlayer insulating layer, and a passivation layer on the source and drain layers;
wherein the first electrode is disposed on a same layer as the light shielding layer;
the first insulating layer is disposed on a same layer as the buffer layer;
the second electrode is disposed on a same layer as the active layer;
the third electrode is disposed on a same layer as the gate layer.

5. The display panel as claimed in claim 1, wherein the thin film transistor comprises:
a light shielding layer on the substrate, a buffer layer on the light shielding layer, an active layer on the buffer layer, a gate insulating layer on the active layer, a gate layer on the gate insulating layer, an interlayer insulating layer on the gate layer, source and drain layers on the interlayer insulating layer, and a passivation layer on the source and drain layers;
wherein the first electrode is disposed on a same layer as the light shielding layer;
the first insulating layer is disposed on a same layer as the buffer layer;
the second electrode is disposed on a same layer as the active layer;
the third electrode is disposed on a same layer as the source and drain layers.

6. The display panel as claimed in claim 1, wherein the storage capacitor further comprises a fourth electrode;
wherein when the third electrode is disposed on a same layer as the gate layer, the fourth electrode is disposed on a same layer as the source and drain layers.

7. A method of manufacturing a display panel comprising:
providing a substrate;
forming a thin film transistor and a storage capacitor on the substrate; and
forming organic light-emitting layers on the thin film transistor and the storage capacitor;
wherein the storage capacitor comprises a first electrode, a first insulating layer, a second electrode, a second insulating layer, and a third electrode sequentially stacked on the substrate, an orthogonal projection of the second electrode on the second insulating layer is on the second insulating layer, and an orthogonal projection area of the second electrode on the substrate is equal to an orthogonal projection area of the second insulating layer on the substrate.

8. The method as claimed in claim 7, wherein an orthogonal projection area of the second electrode on the substrate is smaller than an orthogonal projection area of the second insulating layer on the substrate.

9. The method as claimed in claim 7, wherein the second insulating layer comprises aluminum oxide.

10. The method as claimed in claim 7, wherein the thin film transistor comprises:
a light shielding layer on the substrate, a buffer layer on the light shielding layer, an active layer on the buffer layer, a gate insulating layer on the active layer, a gate layer on the gate insulating layer, an interlayer insulating layer on the gate layer, source and drain layers on the interlayer insulating layer, and a passivation layer on the source and drain layers;
wherein the first electrode is disposed on a same layer as the light shielding layer;
the first insulating layer is disposed on a same layer as the buffer layer;
the second electrode is disposed on a same layer as the active layer;
the third electrode is disposed on a same layer as the gate layer, or the third electrode is disposed on a same layer as the source and drain layers.

11. The method as claimed in claim 7, wherein the storage capacitor further comprises a fourth electrode;
wherein when the third electrode is disposed on a same layer as the gate layer, the fourth electrode is disposed on a same layer as the source and drain layers.

12. A display module comprising a display panel, wherein the display panel comprises an array substrate comprising a substrate, a thin film transistor and a storage capacitor on the substrate;
the storage capacitor comprises a first electrode on the substrate, a first insulating layer on the first electrode, a second electrode on the first insulating layer, a second insulating layer on the second electrode, and a third electrode on the second insulating layer;
wherein an orthogonal projection of the second electrode on the second insulating layer is on the second insulating layer, and an orthogonal projection area of the second electrode on the substrate is equal to an orthogonal projection area of the second insulating layer on the substrate.

13. The display module as claimed in claim 12, wherein an orthogonal projection area of the second electrode on the substrate is smaller than an orthogonal projection area of the second insulating layer on the substrate.

14. The display module as claimed in claim 12, wherein the second insulating layer comprises aluminum oxide.

15. The display module as claimed in claim 12, wherein the thin film transistor comprises:
a light shielding layer on the substrate, a buffer layer on the light shielding layer, an active layer on the buffer layer, a gate insulating layer on the active layer, a gate layer on the gate insulating layer, an interlayer insulating layer on the gate layer, source and drain layers on the interlayer insulating layer, and a passivation layer on the source and drain layers;
wherein the first electrode is disposed on a same layer as the light shielding layer;
the first insulating layer is disposed on a same layer as the buffer layer;
the second electrode is disposed on a same layer as the active layer;
the third electrode is disposed on a same layer as the gate layer.

16. The display module as claimed in claim 12, wherein the thin film transistor comprises:
a light shielding layer on the substrate, a buffer layer on the light shielding layer, an active layer on the buffer layer, a gate insulating layer on the active layer, a gate layer on the gate insulating layer, an interlayer insulating layer on the gate layer, source and drain layers on the interlayer insulating layer, and a passivation layer on the source and drain layers;
wherein the first electrode is disposed on a same layer as the light shielding layer;
the first insulating layer is disposed on a same layer as the buffer layer;
the second electrode is disposed on a same layer as the active layer;
the third electrode is disposed on a same layer as the source and drain layers.

17. The display module as claimed in claim 12, wherein the storage capacitor further comprises a fourth electrode;

wherein when the third electrode is disposed on a same layer as the gate layer, the fourth electrode is disposed on a same layer as the source and drain layers.

* * * * *